United States Patent [19]

Kokta et al.

[11] 4,202,930
[45] May 13, 1980

[54] LANTHANUM INDIUM GALLIUM GARNETS

[75] Inventors: Milan R. Kokta, San Diego, Calif.; Robert C. Linares, Warren Township, Somerset County; Michael A. Di Giuseppe, Succasunna, both of N.J.

[73] Assignee: Allied Chemical Corporation, Morris Township, Morris County, N.J.

[21] Appl. No.: 941,891

[22] Filed: Sep. 13, 1978

Related U.S. Application Data

[63] Continuation-in-part of Ser. No. 876,820, Feb. 10, 1978, abandoned.

[51] Int. Cl.$^2$ .................. C04B 35/40; H01F 1/00; C01F 17/00
[52] U.S. Cl. ................ 428/539; 156/616 R; 156/617 SP; 156/DIG. 63; 156/DIG. 70; 252/62.57; 423/263; 428/900
[58] Field of Search ............... 428/900, 539; 23/305 RE; 252/62.57; 423/263; 156/DIG. 63, 616 R, 617 SP, DIG. 70

[56] References Cited

U.S. PATENT DOCUMENTS

| | | | |
|---|---|---|---|
| 3,947,372 | 3/1976 | Shinagawa et al. | 252/62.57 |
| 3,951,729 | 4/1976 | Tagaki et al. | 156/DIG. 63 |
| 3,959,006 | 5/1976 | Herrnring | 252/62.57 X |
| 3,995,093 | 11/1976 | Heinz | 428/900 X |
| 4,000,247 | 12/1976 | Yamada et al. | 423/263 |
| 4,034,358 | 7/1977 | Blank | 252/62.57 X |
| 4,040,890 | 8/1977 | Burrus et al. | 156/DIG. 63 |
| 4,077,832 | 3/1978 | Robertson et al. | 252/62.57 X |
| 4,092,208 | 5/1978 | Brice et al. | 156/DIG. 63 |
| 4,135,963 | 1/1979 | Fukuda | 156/617 SP |
| 4,144,117 | 3/1979 | Fukuda et al. | 156/617 SP |

OTHER PUBLICATIONS

Chemical Abstracts (1972) vol. 77, p. 429, No. 120353d, "Optical Properties of La–In–Ga Garnet Single Crystals."
"Journal of Crystal Growth" 12 (1972), North Holland Publishing Co., Brandle et al., pp. 3–8.
"The Growth of Single Crystals", Landise Solid State Physical Electronics Series, Prentice-Hall, Ch-5, pp. 159–173.
"Journal of Crystal Growth" 13/14 (1972) North Holland Publishing Co., Landise, Single Crystals for Bubble Darwain Memories, pp. 27–33.

*Primary Examiner*—Harold Ansher
*Attorney, Agent, or Firm*—Ernest D. Buff; Gerhard H. Fuchs

[57] ABSTRACT

Congruently melting compositions of gallium garnets containing lanthanum are provided in which trivalent indium is partially substituted for gallium. The lanthanum indium gallium garnets have larger lattice parameters than other rare earth gallium garnets. The lanthanum indium gallium garnets of the invention are represented by the formula $$La_a In_b Ga_c O_{12}$$

where "a" ranges from greater than about 3.24 to less than 3.32, "b" ranges from greater than about 1.84 to less than about 2.24 and "c" ranges from greater than about 2.48 to less than about 2.88, the total of "a" plus "b" plus "c" being 8. The garnets of the invention are useful as single crystal substrates for supporting magneto-optic and magnetic garnet thin films having large lattice parameters approaching 13 Å.

7 Claims, No Drawings

LANTHANUM INDIUM GALLIUM GARNETS

CROSS REFERENCE TO RELATED APPLICATION

This is a Continuation-in-Part application of Ser. No. 876,820, filed Feb. 10, 1978, now abandoned.

BACKGROUND OF THE INVENTION

1. Field of the Invention

The invention is related to congruently melting lanthanum indium gallium garnets, which are suitable as substrates in magneto-optic and magnetic thin film applications.

2. Description of the Prior Art

The garnet family contains hundreds of compounds with the same crystal structure (cubic; space group Ia3d), and the number of new compounds being discovered is constantly increasing. The garnet structure with its three cation sublattices capable of accepting ions in different coordination polyhedra (dodecahedral, octahedral and tetrahedral) offers numerous ways of varying the physical properties of the resulting compounds. Substitutions are governed by strict rules based on the crystal chemistry of ternary and more complex systems. Garnet materials have found suitable use in applications such as optical materials, magneto-optic materials, magnetic bubble materials and substrate materials.

Of optical materials, only neodymium-doped yttrium aluminium garnet (YAG:Nd) has attained substantial commercial use as a laser. Typically, this garnet is employed in bulk single crystal form, and does not usually involve substrate material.

With regard to magneto-optic materials, applications of the Faraday rotation effect have resulted in efforts to prepare garnets containing praseodymium, neodymium and bismuth, since these ions display high rotation effects in garnet materials. However, these ions also increase the lattice parameter of such garnets. Because these materials are in the form of thin films expitaxially grown on a substrate, compromises must be made between the amount of ions present which contribute to a high Faraday rotation and the lattice parameter of the substrate in order to achieve as close a match as possible in lattice parameters of the thin film and substrate. Otherwise, the resulting mismatch in lattice parameters results in undue strain, which detrimentally affects the desired properties.

With regard to magnetic bubble domain materials, a large number of such materials have been developed, but materials evidencing such desirable properties as high bubble mobility and small bubble diameter ($<1.0$ $\mu$m) often possess lattice parameters that are larger than those of commercially available substrates. Again, a compromise must be made between the properties of such materials and the lattice parameter of the substrate in order to achieve lattice matching of the thin film and substrate. Typically, it is desired to match lattices within at least a fraction of 1%.

With regard to substrate materials, utilization of any new garnet material and the expansion of garnet thin-film technology depends on the availability of substrate material with a range of lattice parameters. Because of recent work on high Faraday rotation materials and on new magnetic bubble domain materials, there is increased effort on the crystal chemistry and crystal growth of garnets that can meet present and future requirements. In order to provide magneto-optic materials and magnetic bubble domain materials having optimum properties without compromising lattice parameters, new substrate materials having larger lattice parameters than heretofore available are needed. At present, the only material available in large scale is gadolinium gallium garnet (GGG; $Gd_3Ga_5O_{12}$), which has a lattice parameter $a_o$ of 12.384 Ångstroms (Å). Mixtures of gadolinium gallium garnet and neodymium gallium garnet (NdGG; $Nd_3Ga_5O_{12}$; $a_o = 12.504$ Å) have been utilized as substrate material to achieve lattice parameters which range linearly with composition from 12.384 to 12.504 Å. However, materials suitable for substrates having lattice parameters up to about 13 Å are required in order to accommodate new magnetic materials, such as new magneto-optic and magnetic bubble materials, having such larger lattice parameters.

Further, such materials must be capable of forming single crystals by melt-growth techniques so as to yield single crystals of a size suitable for substrate fabrication. In order to grow single crystals of a particular composition from the melt, that composition must exhibit congruent melting.

Garnets specifically including indium ($In^{3+}$) have been previously reported. For example, the preparation of polycrystalline $Y_3In_2Ga_3O_{12}$, with $a_o = 12.548$ Å, was reported in the *Journal of Applied Crystallography*, Vol. 6, pp. 416-7 (1973).

The use of $Sm_3Ga_{5-x}In_xO_{12}$ to support bismuth-substituted $Gd_3Fe_5O_{12}$ magneto-optic films was reported in *AIP Conference Proceedings*, No. 18, Part 2, pp. 944-948 (1974). However, no values of "x" or $a_o$ were reported.

A description of small (about 4 mm), crystals having the composition $La_{2.97}In_{1.94}Ga_{3.09}O_{12}$ appeared in *Chemical Abstracts*, Vol. 77, p. 429, No. 120353d (1972). Although the lattice parameter was given as 12.915 Å, small crystals are not suitable for substrate use, which requires boules of at least 0.5 inch diameter and 2 inch length. Further, the composition has been found to be incongruently melting, which renders it unsuitable for growing large boules by melt-growth techniques, such as Czochralski or Bridgman-Stockbarger, for substrate applications.

Thus, prior art garnets are not available evidencing both a large lattice parameter (e.g., about 13 Å) and congruent melting.

In addition to the desired increase in lattice parameters indicated above, suitable substrate materials must be non-ferromagnetic, in order to avoid magnetic coupling effects which would deleteriously affect the supported thin film. Also, the substrate material must be chemically stable.

SUMMARY OF THE INVENTION

In accordance with the invention, congruently melting compositions of lanthanum indium gallium garnets are provided. The compositions evidence large lattice parameters approaching 13 A. The increase in lattice parameter and congruent melting behavior is obtained for lanthanum indium gallium garnets represented by the formula $$La_a In_b Ga_c O_{12}$$

where "a" ranges from greater than about 3.24 to less than 3.32, "b" ranges from greater than about 1.84 to less than about 2.24 and "c" ranges from greater than about 2.48 to less than about 2.88, the total of "a" plus "b" plus "c" being 8; and also for lanthanum indium gallium garnets having the compositions $La_{3.22}In_{2.10}Ga_{2.58}O_{12}$ and $La_{3.32}In_{1.88}$ and $Ga_{2.80}O_{12}$. Single crystals of composition of the invention are non-ferromagnetic, transparent and chemically stable.

Also in accordance with the invention, a composite is provided comprising a substrate, which comprises a melt-grown single crystal of the lanthanum indium gallium garnets described above and a magnetic garnet thin film bonded thereto.

The method of forming the combination of a magnetic film on a substrate having the inventive composition comprises (a) growing a single crystal of this composition having a desired crystallographic orientation by a suitable melt-growth technique, (b) fabricating slices from the single crystal to obtain substrates having smooth surfaces and a desired crystallographic orientation, and (c) epitaxially forming the magnetic film on the substrate.

The single crystals are conveniently grown using the well-known unidirectional solidification melt-growth techniques of either Czochralski or Bridgman-Stockbarger methods, or suitable modifications of these.

DETAILED DESCRIPTION OF THE INVENTION

In accordance with the invention, congruently melting lanthanum indium gallium garnets evidencing large lattice parameters approaching 13 Å are provided. The increase in lattice parameter and congruent melting behavior is obtained for lanthanum indium gallium garnets represented by the formula $$La_aIn_bGa_cO_{12}$$

where "a" ranges from greater than about 3.24 to less than 3.32, "b" ranges from greater than about 1.84 to less than about 2.24, and "c" ranges from greater than about 2.48 to less than about 2.88, the total of "a" plus "b" plus "c" being 8. In addition, the aforementioned increase in lattice parameter and congruent melting behavior is obtained for lanthanum indium gallium garnet compositions $La_{3.32}In_{2.10}Ga_{2.58}O_{12}$ and $La_{3.32}In_{1.88}Ga_{2.80}O_{12}$.

These garnets in single crystalline form are suitable substrate materials for supporting magnetic thin films, including magneto-optic and magnetic thin films, having lattice parameters approaching 13 Å.

The values of "a", "b" and "c" are constrained by congruent melting considerations. Deviations from the listed values result in non-congruent melting material. While such non-congruent melting material may be suitable for forming single crystals by flux growth techniques, such flux-grown crystals are usually small (about 5 mm on edge) and hence unsuitable as substrates for supporting thin films of magnetic garnets. In contrast, the congruently melting compositions of the invention are easily melt-grown by techniques such as Czochralski, Bridgman-Stockbarger, and varients of these. Such melt-growth techniques permit growth of boules having diameters of 1 to 2 inches and more and having lengths of several inches. Such boules may then be sliced, and polished and otherwise suitably processed into substrates.

The values of "a", "b" and "c" listed above repesent the outer limits of congruent melting, and, except for the specific lanthanum indium gallium garnet compositions $La_{3.32}In_{2.10}Ga_{2.58}O_{12}$ and $La_{3.32}In_{1.88}Ga_{2.80}O_{12}$, it is essential that the compositions of the invention have values within these limits. Examples of preferred compositions are those of lanthanum indium gallium garnets in which "a" is about 3.28, "b" ranges from about 1.92 to 2.16 and "c" ranges from about 2.56 to 2.80, the total of "a", "b" and "c" being 8. Such preferred compositions evidence lattice parameters of about 12.98 Å.

Large single crystals in the form of cylindrical rods are required for the production of substrate wafers for epitaxial film growth thereon. Such single crystals must be at least 0.5 inch in diameter and 2 inches in length in order to orient and slice the crystal into a number of substrates, which are then polished. Techniques such as vapor, flux and hydrothermal growth are considered to be unsuitable, due to low growth rates, second phase formation, large changes in composition as a result of included impurities or inability to form sufficiently large crystals for substrate use.

The desired single crystals are most economically achieved by melt-growth processes such as Czochralski, Bridgman-Stockbarger or Verneuil. Of these, only the Czochralski or Bridgman-Stockbarger techniques, or suitable modifications of these, produce single crystals of the uniformity, perfection, purity and size required for use as substrates. Single crystals of the congruently melting compositions of the invention are clear and transparent.

Both Czochralski and Bridgman-Stockbarger growth processes involve unidirectional solidification from the melt, which requires that the charge material be congruently melting. Iridium, platinum or platinum-coated iridium crucibles are used to contain the melt.

In the Czochralski technique, the use of an iridium crucible requires an inert atmosphere, such as nitrogen or argon. A small particle pressure of $O_2$, about 0.5 to 4.0%, is used, however, to suppress the loss of $Ga_2O_3$ and/or $In_2O_3$, which otherwise vaporizes at the temperatures employed in the growth process (about 1550° C.). Platinum or platinum-coated iridium crucibles, on the other hand, may be used in air. Pull rates of about 0.1 to 8.0 mm/hr are conveniently employed in conjunction with rotation rates of about 5 to 50 rpm.

In the Bridgman-Stockbarger technique, the atmospheric requirements are identical to those of the Czochralski technique for the previously described crucible materials. The Bridgman-Stockbarger technique, on the other hand, also offers the option of sealing the crucibles to prevent the loss of $Ga_2O_3$ and/or $In_2O_3$. Cooling rates of about 0.1 to 50° C./hr are conveniently employed during growth in conjunction with a temperature gradient of about 25° C./in along the crucible length.

Following growth of single crystal boules by one of the above techniques, slices of the boule having a desired crystallographic orientation may be ground and polished and otherwise suitably prepared for substrates, utilizing conventional techniques known in the prior art.

The crystallographic orientation of the substrate depends on the particular application. For example, present magnetic bubble device technology utilizes substrates having a (111) orientation. Magnetic films having the garnet structure for use in magneto-optic or magnet bubble applications are then epitaxially formed on the surface of the slices. Epitaxial deposition may be performed by well-known prior art techniques, such as liquid phase epitaxy (LPE) or chemical vapor deposition (CVD) or hydrothermal growth.

Examples of compositions of magnetic garnet thin films which may be supported by substrates of the invention include $RE_{3-x}Bi_xFe_5O_{12}$ for use in magneto-optic applications and $Eu_{3-y}Ca_yFe_{5-y}Ge_yO_{12}$ for use in magnetic bubble device applications. In the former composition, RE is typically neodymium, gadolinium, thulium or praseodymium and "x" ranges from 0 to about 2. In the latter composition, "y" is about 1. Such compositions typically include iron, and the films are usually about 2 to 10 μm thick.

The substrates having compositions in accordance with the invention evidence an acceptable degree of crystalline perfection and are readily made smooth and flat for the indicated magneto-optic and magnetic device applications. The substrates are chemically stable, transparent and non-ferromagnetic. These properties, together with their large lattice parameters, enable new magneto-optic and magnetic films to be supported without compromise in properties.

EXAMPLES

Various polycrystalline compositions were prepared by direct sintering of stoichiometric quantities of dried $La_2O_3$, $Ga_2O_3$ and $In_2O_3$. The oxides were heated in a furnace in platinum crucibles to 1350° C. for several hours. Following removal of the crucibles from the furnace, the oxides were ground and refired at temperatures between 1350° C. and 1450° C. After several firing and grinding cycles, the sintered compositions were evaluated by X-ray diffraction and differential thermal analysis (DTA) to determine the extent of multiple phases (if any) and the degree of incongruent melting (if any).

The thermal analysis experiments were performed on a Mettler TA-1 thermoanalyzer. A high temperature furnace capable of reaching 1600° C. was operated in a medium of flowing, dry air (flow rate: 75 cm³/min). The temperature was monitored with a Pt-PtRh10% thermocouple with the reference junction immersed in a 25° C. constant temperature bath. Programmed heating and cooling rates of 15° C./min were employed. The sample material (about 100 mg) was weighed into a platinum cup which was then inserted into a PtRH10% crucible (uncovered) that was provided for the sample holder. Aluminum oxide was chosen as the reference material. In all the experiments, the DTA, the thermogravimetric and the derivative thermogravimetric curves were simultaneously obtained. At the termination of the experiment, any changes in weight were corroborated by reweighing the cup and sample.

The lattice parameter was measured using a Norelco vertical X-ray diffractometer in parafocus geometry, using copper radiation. An AMR curved graphite crystal monochromator sold by Advanced Metals Research Corporation of Burlington, Mass. was used to pass CuKβ wavelength to the detector. The sample was scanned at 21° C. from 10° to 120° 2θ at a scan speed of 1° 2θ/min. A Philips silicon standard ($a_o=5.43062$ Å at 21.0° C.) was examined under similar conditions to calibrate this instrument. A linear least squares refinement procedure of 31 reflections from the sample was performed.

Since an external standard was used, the criterion of zero slope "m" in the relation $$\Delta\theta = m\theta + B$$

where B is 0.004°, was used to remove errors introduced during manual scan start.

The following compositions were prepared as above, with the lattice parameter and DTA results as listed below.

| Composition | Lattice Parameter, Å | DTA |
|---|---|---|
| $La_{3.28}In_{1.92}Ga_{2.80}O_{12}$ | 12.9810±0.0005 | Congruent melting |
| $La_{3.28}In_{1.96}Ga_{2.76}O_{12}$ | | —do— |
| $La_{3.28}In_{2.00}Ga_{2.72}O_{12}$ | | —do— |
| $La_{3.28}In_{2.08}Ga_{2.64}O_{12}$ | | —do— |
| $La_{3.28}In_{2.12}Ga_{2.60}O_{12}$ | | —do— |
| $La_{3.28}In_{2.16}Ga_{2.56}O_{12}$ | 12.985±0.001 | —do— |
| $La_{3.32}In_{2.10}Ga_{2.58}O_{12}$ | | —do— |
| $La_{3.32}In_{1.88}Ga_{2.80}O_{12}$ | | —do— |

For comparison, the compositions listed below were observed to be incongruent melting, as determined by DTA.

| Composition | DTA |
|---|---|
| $La_{3.28}In_{1.84}Ga_{2.88}O_{12}$ | Incongruent melting |
| $La_{3.28}In_{2.24}Ga_{2.48}O_{12}$ | —do— |
| $La_{3.24}In_{2.20}Ga_{2.56}O_{12}$ | —do— |
| $La_{3.32}In_{2.12}Ga_{2.56}O_{12}$ | —do— |
| $La_{3.24}In_{1.92}Ga_{2.84}O_{12}$ | —do— |
| $La_{3.32}In_{1.92}Ga_{2.76}O_{12}$ | —do— |

We claim:

1. A congruently melting composition of a lanthanum indium gallium garnet having the formula $$La_aIn_bGa_cO_{12}$$

where "a" ranges from greater than about 3.24 to less than 3.32, "b" ranges from greater than about 1.84 to less than about 2.24 and "c" ranges from greater than about 2.48 to less than about 2.88, the total "a" plus "b" plus "c" being 8.

2. The composition of claim 1 in which "a" is about 3.28, "b" ranges from about 1.92 to 2.16 and "c" ranges from about 2.56 to 2.80, the total of "a", "b" and "c" being 8.

3. The compositions of claim 2 selected from the group consisting of $La_{3.28}In_{1.92}Ga_{2.80}O_{12}$ and $La_{3.28}In_{2.16}Ga_{2.56}O_{12}$.

4. A single crystal having the composition of claim 1, the single crystal being grown by a melt-growth technique involving unidirectional solidification of a melt.

5. A single crystal of claim 4, grown by Czochralski or Bridgman-Stockbarger technique.

6. A composite comprising a single crystal substrate having the composition of claim 1 and a magnetic garnet film bonded thereto.

7. A congruently melting composition of a lanthanum indium gallium garnet having a composition selected from the group consisting of $La_{3.32}In_{2.10}Ga_{2.58}O_{12}$ and $La_{3.32}In_{1.88}Ga_{2.80}O_{12}$.

* * * * *